(12) United States Patent
Ochi

(10) Patent No.: US 6,771,478 B2
(45) Date of Patent: Aug. 3, 2004

(54) HOT-SWAP PROTECTION CIRCUIT

(75) Inventor: Sam Seiichiro Ochi, Saratoga, CA (US)

(73) Assignee: Ixys Corporation, Santa Clara, CA (US)

( * ) Notice: Subject to any disclaimer, the term of this patent is extended or adjusted under 35 U.S.C. 154(b) by 0 days.

(21) Appl. No.: 10/029,593

(22) Filed: Dec. 21, 2001

(65) Prior Publication Data
US 2002/0118501 A1 Aug. 29, 2002

Related U.S. Application Data

(60) Provisional application No. 60/258,004, filed on Dec. 22, 2000.

(51) Int. Cl.[7] .............................. H02H 1/06; H02H 1/04
(52) U.S. Cl. ......................................... 361/118; 361/58
(58) Field of Search ............................ 361/58, 111, 118

(56) References Cited

U.S. PATENT DOCUMENTS

| | | | |
|---|---|---|---|
| 5,155,648 A | * | 10/1992 | Gauthier ...................... 361/58 |
| 5,572,395 A | | 11/1996 | Rasums et al. |
| 5,587,685 A | * | 12/1996 | Johansson .................... 327/546 |
| 5,698,973 A | | 12/1997 | Goerke et al. |
| 5,760,571 A | * | 6/1998 | Latham et al. ............... 323/274 |
| 5,892,381 A | * | 4/1999 | Koifman et al. ............ 327/198 |
| 6,127,882 A | | 10/2000 | Vargha et al. |

OTHER PUBLICATIONS

R. Boylestad, L. Nashelsky, Electronic Devices and Circuit Theory, Prentice Hall, 1987, pp. 692–693.*

* cited by examiner

Primary Examiner—Gregory J. Toatley, Jr.
Assistant Examiner—Z Kitov
(74) Attorney, Agent, or Firm—Townsend and Townsend and Crew LLP

(57) ABSTRACT

Embodiments of the present invention provide methods and circuitry for protecting a circuit during hot-swap events. Hot swap protection circuitry includes as overcurrent detection circuit which decouples power from a load. Circuitry is provided to detect ground-fault conditions. Noise detection circuitry is provided to reduce noise in the power that is delivered to the load.

19 Claims, 8 Drawing Sheets

HOT-SWAP PROTECTION CIRCUIT

CROSS-REFERENCES TO RELATED APPLICATIONS

The present application is related to and claims priority from U.S. Provisional Application No. 60/258,004, filed Dec. 22, 2000.

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK.

NOT APPLICABLE

BACKGROUND OF THE INVENTION

The present invention relates generally to integrated circuits. More particularly, the invention relates to a method and circuitry for hot-swap protection circuits.

A hot swap operation is an insertion action or a removal action of a device while the system using it is receiving power, coupling the power from the system to the device. Such an operation can cause external capacitors to draw currents high enough to disturb system operations or even cause permanent damage to either or both the device and the system.

Hot-swap protection circuits enable electronic circuits to be connected to each other and disconnected from each other while powered. Hot-swap protection circuits are required in many applications where it is not practical to shut down an electronic system while replacing or adding circuit boards to it. Such protection circuits, or systems, are used in telephone switching hubs, corporate network server hubs, and in laptop or desktop computers with PCMCIA connectors. All of the examples require connection or disconnection under power and so on.

Conventional hot-swap protection circuits employ connectors with at least one set of sensor pins, which are a set of extra long and extra short pins, connected to voltage detectors. These sensor pins allow immediate detection of connection and/or disconnection by sensing the presence and/or absence of the applied voltage. It is well known that a single set of sensor pins—whether at the top, middle, or bottom—might not be enough to detect a hot-swap event.

For the best reliability, it is often necessary to use two sets of sensor pins, one set at the top and one set at the bottom of a hot-swappable card. Adding additional sets of sensor pins increase reliability, but increases costs to the overall system. Additionally, conventional hot-swap protection systems using sensor pins do not always detect the application or removal of power to a system.

BRIEF SUMMARY OF THE INVENTION

The present invention provides a method and circuitry for hot swap operations. Application of power from a source of power is detected by first circuitry. A switch couples the power to the device in a gradual manner in responsive to the first circuitry. Circuitry is provided which detects an overcurrent condition in which the current draw by the device exceeds a predetermined level. The switch decouples the device from the power responsive to the circuitry. Circuitry is provided detects events in which power is removed momentarily, as occurs in a ground-fault condition, or permanently as in a disconnect event, and in response thereto a signal is produced indicative of the occurrence. Circuitry, which is responsive to noise in the power, is operatively coupled with the switch which varies its conductance in response to the detected noise.

Embodiments of the present invention achieve their purposes and benefits in the context of known circuit and process technology and known techniques in the electronic and process arts. Further understanding, however, of the nature, features, and advantages of the present invention is realized by reference to the latter portions of the specification, accompanying drawings, and appended claims. Other features and advantages of the present invention will become apparent upon consideration of the following detailed description, accompanying drawings, and appended claims.

DETAILED DESCRIPTION OF THE INVENTION

Figure 1:
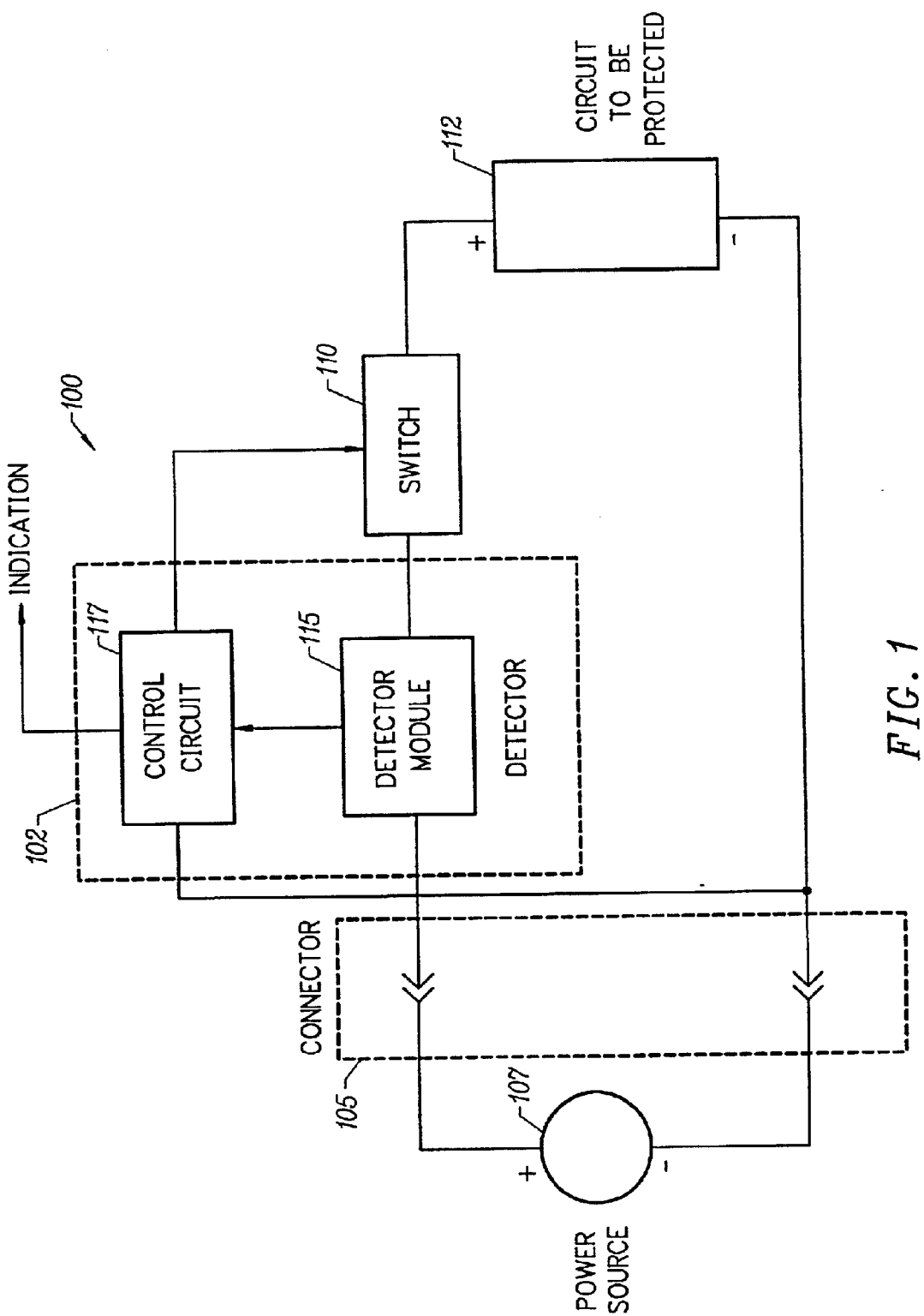
FIG. 1 is a simplified high-level block diagram of an electronic hot-swap protection circuit, according to one embodiment of the present invention.

FIG. 1 is a simplified high-level block diagram of an electronic hot-swap protection circuit 100, according to one embodiment of the present invention. FIG. 1 shows a detector 102 coupled in series, via a connector 105, to an electrical power source 107. Detector 102 also couples in series to a fast-disconnect, slow-reconnect switch 110. Switch 110 couples in series along a power supply conductor between a load 112 (circuit to be protected, target circuit, device, etc.) and power source 107. Detector 102 includes an overcurrent detector module 115 and a control circuit 117. Detector module 115 is series-coupled between switch 110 and a first terminal of connector 105. Control circuit 117 is coupled to a second terminal of connector 105. Detector module 115 includes an output that feeds into control circuit 117.

In this specific embodiment, detector module 115 and switch 110 couple to the positive terminal of power supply 107, and control circuit 117 couples to the negative terminal of power supply 107. Alternatively, detector module 115 and switch 110 can be located on the negative terminal of power source 107, with appropriate modifications to the circuitry.

In operation, detector 102 detects whether load 112 is hot-swapped in, i.e., reconnected to power source 107. When detector 102 detects a reconnect event, it outputs a hot-swap occurrence indication, or "indication," or "control signal." More specifically, detector 102 sends a hot-swap occurrence indication, i.e., a reconnect control signal, to switch 110 instructing it to close, i.e., turn on, in accordance with the invention.

Hot-Swap Occurrence Indication

In this and in other embodiments of the present invention, the hot-swap occurrence indication can serve other functions and will depend on the specific application. For example, the indication can be coupled to drive an LED to notify a user of the hot-swap occurrence. The indication can also be coupled to a controller or microprocessor in the form of an interrupt signal, for example, so that appropriate processing can be performed.

In this specific embodiment, the reconnect control signal is produced by control circuit 117. Also, in this specific embodiment, switch 110 opens quickly but closes slowly. Upon reconnection, the conductivity of switch 110 gradually increases to a fully conductive state, i.e., non-binary change of state that is gradual as opposed to discrete.

Upon detection of a reconnect event, detector module 115 produces a signal indicative of a reconnect event. The signal feeds to control circuit 117 which then produces an indication signal and a control signal. The control signal feeds to switch 110. As will be explained below, the control signal is of a nature as to cause switch 110 to gradually increase its conductance (i.e., gradually decrease its resistance).

A reconnect event is typified by a detection of a presence of voltage following the absence of current. The term "reconnect" implies the load 112 was previously connected. However, it is possible that a load might never have been connected to the powered system, in which case the term "connect" is more appropriate. For purposes of this disclosure, however, the terms "reconnect" and "connect" are used interchangeably, since both situations are the same from the point of view of a hot swap operation.

Figure 2:
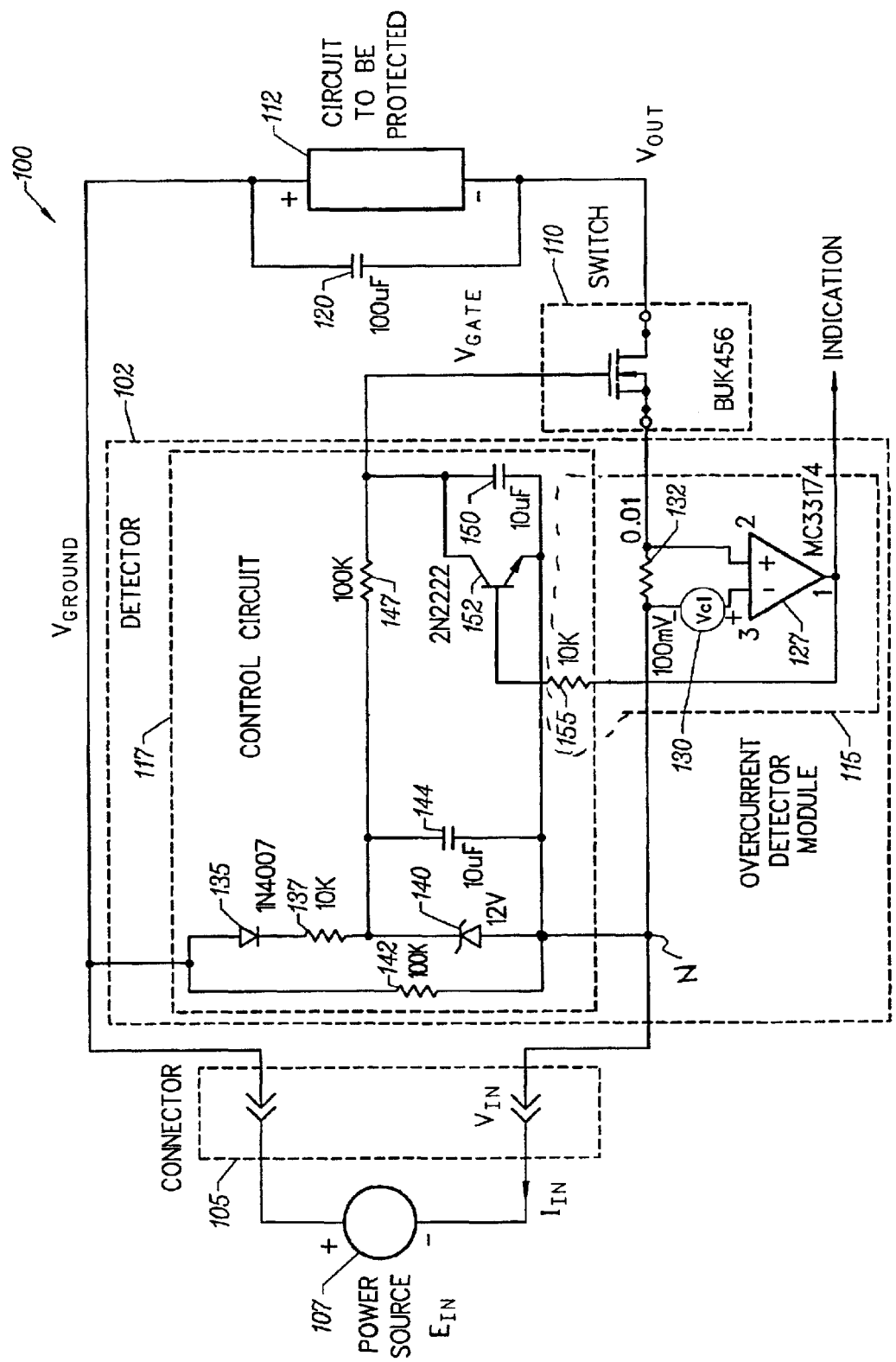
FIG. 2 is a simplified high-level schematic diagram of the hot-swap protection circuit of FIG. 1, according to one embodiment of the present invention.

FIG. 2 is a simplified high-level schematic diagram of a hot-swap protection circuit 100 in accordance with an illustrative embodiment of the present invention. Hot-swap protection circuit 100 is implemented with commonly available integrated circuits including discrete-active and -passive components (see FIGS. 6 and 8, for example). Hot-swap protection circuit 100 includes detector 102 and switch 110, both of which are located on the negative terminal of power source 107. Alternatively, in other embodiments, detector 102 and switch 110 can be located on the positive terminal of power source 107 (as in FIG. 1), with appropriate modifications to the circuitry.

Figure 6:
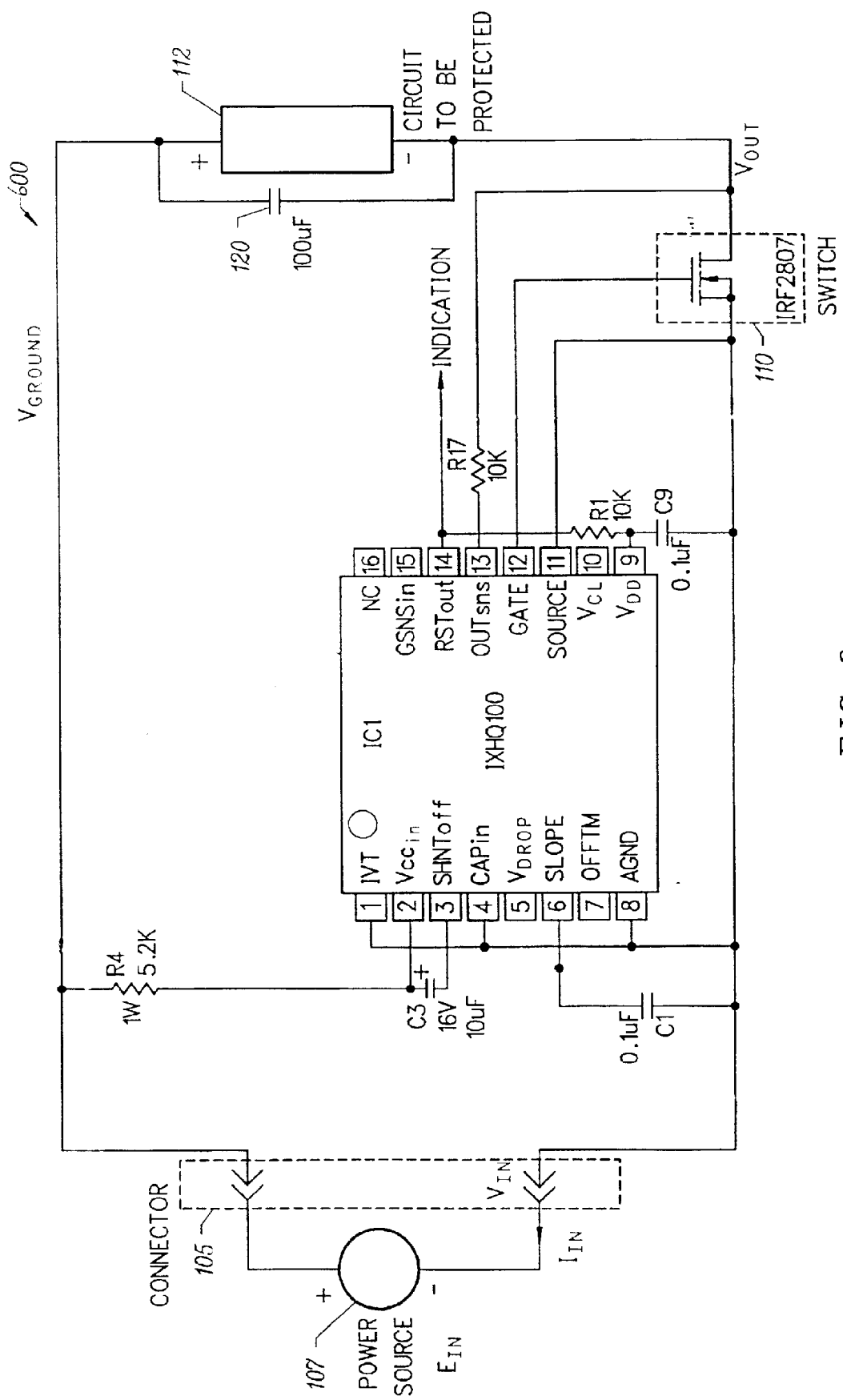
FIG. 6 is a simplified high-level schematic diagram of the hot-swap protection circuit of FIG. 5, according to another embodiment of the present invention.

In this specific embodiment, load 112 couples in parallel to a capacitor 120. FIG. 2 shows a schematic of the switch. Typically, the switch 110 is a MOSFET device such as the one shown in FIG. 2 having a part number BUK456. Of course, other commercially available switches can be substituted; e.g., FIG. 6 shows a FET having a part number IRF2807.

Detector module 115 includes an operational amplifier 127, or op-amp 127, configured to output a hot-swap occurrence indication, e.g., a reconnect control signal. The non-inverting input of op-amp 127 couples to switch 110 and inverting input of op-amp 127 couples to the negative terminal of power source 107 via a voltage source 130. A resistor 132 couples between the inverting and non-inverting inputs of op-amp 127. In this specific embodiment, for example, op-amp 127 is implemented with an integrated circuit operational amplifier identified by the part number MC33174. Other commercially available op-amps or similar devices can be used.

Control circuit 117 includes a diode 135, resistor 137, and a Zenor diode 140 coupled in series between the positive and negative terminals of power source 107. A resistor 142 and a capacitor 144 couple in parallel between the positive and negative terminals of power source 107. A resistor 147 and a capacitor 150 couple in series with capacitor 144. A transistor 152 couples between a gate switch 110 (node $V_{GATE}$) and the negative terminal of power source 107. Transistor 152 has a gate coupled to the output of op-amp 217. Node $V_{GATE}$ couples control circuit 117 to switch 110.

In operation, generally, hot-swap protection circuit 100 of FIG. 2 functions to enable the soft (gradual) application of the voltage at node $V_{IN}$ to the load 112. This soft application reduces the stress to the components within load 112 as well as to capacitor 120. Such stress can cause physical damage to these components. For example, if an instantaneous voltage is applied across load 112 or capacitor 120, it is theoretically possible to cause infinite current flow through load 112 or capacitor 120. This can either degrade them or immediately cause them to explode, causing physical damage and possible destruction.

Suppose that after load 112 is reconnected for a sufficient amount of time such that the voltage at node $V_{OUT}$ settles to a voltage close that at node $V_{IN}$, and a steady state current flow through load 112 is established. The difference between voltages at nodes $V_{OUT}$ and $V_{IN}$ is simply the load current through load 112 times the sum of the resistances of resistor 132 and a resistance Rdson of switch 110 in the conducting state.

Operation of Detector 102 upon Reconnection

Upon reconnection, hot-swap protection circuit 100 enables a soft turn-on of switch 110 through resistor 147. The soft start sequence is as follows. First, assume that all of the capacitors in control circuit 117, as well as capacitor 120 across the load 112, are discharged so that the potential at node $V_{IN}$ at connector 105 is at zero potential. Second, power source 107 couples to detector module 102 via connector 105. The application of the voltage at node $V_{IN}$ at the output of the connector 105 causes the presence of a voltage $E_{IN}$, i.e., voltage of power source 107 at node N. Capacitor 144 then charges through resistor 137 to 12V, the voltage of which is determined and limited by Zenor diode 140. In other embodiments, Zenor diode 140 can have other values. During this time, the voltage at node $V_{GATE}$ ramps up from zero potential through resistor 147, implementing a "soft" or slow turn-on of switch 110. The voltage at node $V_{OUT}$ then quickly ramps up from a zero potential to the voltage at node $V_{IN}$. The ramp-up rate is determined by the turn-on rate of switch 110 and the size of capacitor 120 across the load 112.

Figure 3:
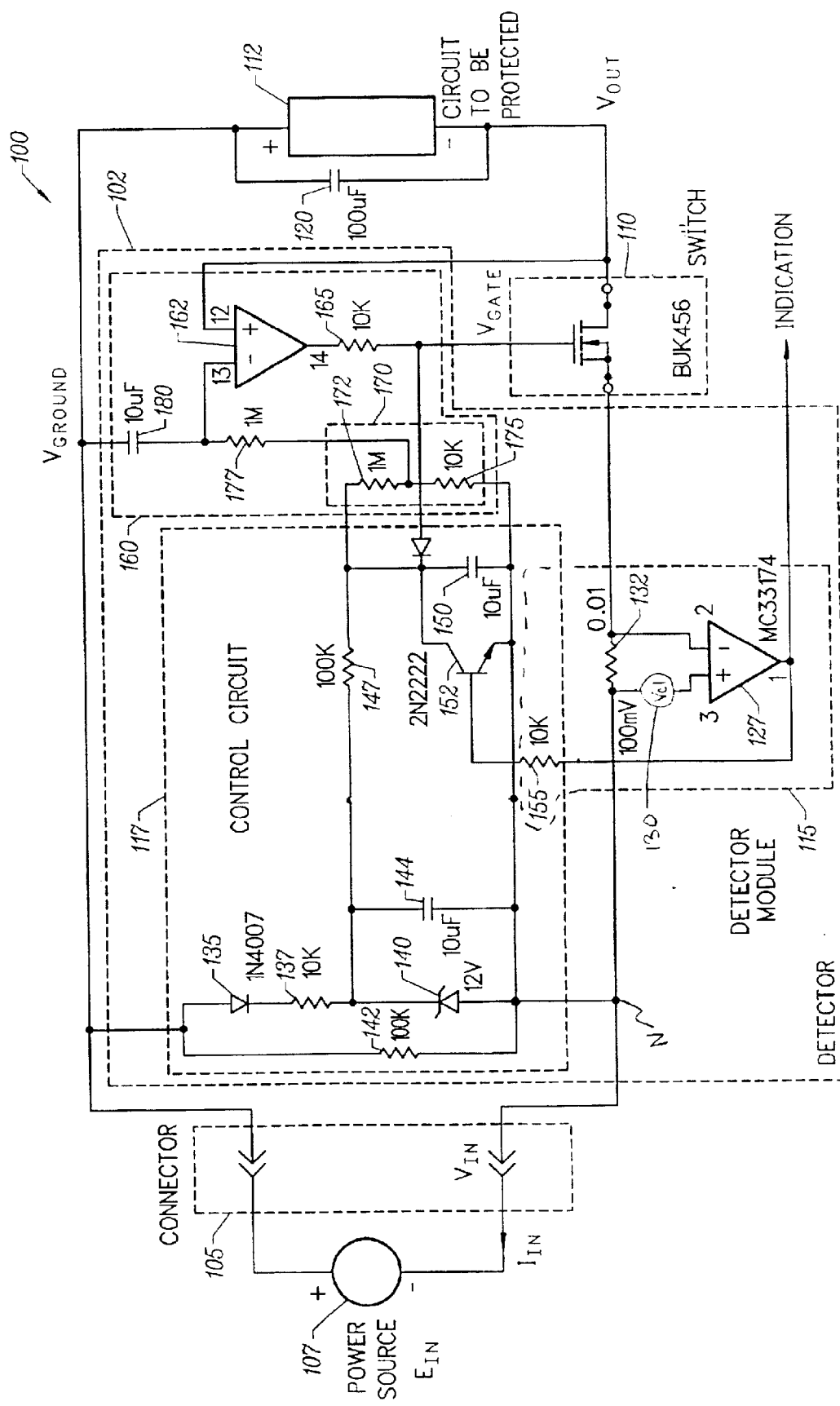
FIG. 3 is a simplified high-level schematic diagram of the hot-swap protection circuit of FIG. 1, according to another embodiment of the present invention.

FIG. 3 is a simplified high-level schematic diagram of a hot-swap protection circuit 100 in accordance with another illustrative embodiment of the invention. Hot-swap protection circuit 100 of FIG. 3 is similar to that of FIG. 2. In the embodiment shown in FIG. 3, detector 102 includes circuit 160.

Circuit 160

Circuit 160 includes an operational amplifier 162, or op-amp 162. An output of op-amp 162 couples to the gate of switch 110, or node $V_{GATE}$, via a resistor 165. Node $V_{GATE}$ couples between resistor 147 and capacitor 150 via a diode 167. A bias voltage source 170 couples in parallel to capacitor 150. In this particular embodiment, bias voltage source 170 is a voltage divider. Bias voltage source 170 includes a resistor 172 and a resistor 175. An inverting input of op-amp 162 couples between resistors 172 and 175 via a resistor 177 and to node $V_{GROUND}$ via a capacitor 180.

In the specific illustrative embodiments of FIGS. 2, 3, 5, 6, 7, and 8, $V_{GROUND}$ located at the positive terminal of power source 107 because the protection circuit of these specific embodiments operates in the negative voltage range. The specific voltage range in which the protection circuit operates will depend on the specific application. For example, the operating voltage range can also be in both the negative and positive voltage ranges. In some embodiments, the operating voltage range can only positive voltage ranges, for example, where $V_{GROUND}$=0V.

Operation of Circuit 160

Circuit 160 protects load 112 from noise that might be present in power source 107. Circuit 160 operates in conjunction with switch 110 to effectively function as a low pass filter of the power from power source 107, thus reducing the effects of noise present in the power. The op-amp 162 is configured as a voltage follower. Noise from power source 107 will propagate through network 170 to the inverted input 13 of op-amp 162 through the network of resistor 177 and capacitor 180. The noise components will cause a differential input to appear at the input of op-amp 162. The resulting output of op-amp 162 will drive switch 110 to alter its conductivity as a function of the noise. This in turn alters the current flow to load 112. Consequently, the power delivered to load 112 will be effectively low-pass filtered by the switch. Thus, by altering the conductivity of the switch 110 in response to noise present in the power, the noise components in the power delivered to the load 112 can be reduced.

Operation of Overcurrent Detector Module 115 (Load Connected)

The following description assumes that load 112 has been connected to power source 107 through switch 110, which is on, and through overcurrent detector module 115. As long as the voltage drop across resistor 132 is less than voltage source 130, e.g., Vcl=100 mV, the output of op-amp 127 will be low, or at the voltage at node $V_{IN}$. This keeps transistor 152 of control circuit 117 off and node $V_{GATE}$ high which keeps switch 110 on.

An overcurrent condition is one where load 112 demands a much higher than normally expected current. For example, suppose that the current is so high that the voltage drop across resistor 132 is greater than 100 mV. This causes the non-inverting input of op-amp 127 to become more positive than its inverting input. Note that the voltage differential across the non-inverting and the inverting inputs occurs when a detected overcurrent condition is detected. In this specific example, an overcurrent is detected when the voltage drop across resistor 132 is greater than 100 mV, or if greater than 10 amps of current flow through resistor 132. The threshold current which defines an overcurrent condition can be predetermined by setting voltage level of voltage source 130 accordingly.

Upon detection of an overcurrent condition, overcurrent detector module 115 causes the output of op-amp 127 to go high, or +12V. This turns on transistor 152 to discharge capacitor 150 to the voltage at node $V_{IN}$. This discharged of capacitor 150, Vcl=~0V, causes switch 110 in switch 110 to turn off which results the disconnection of load 112. After switch 110 turns off, the output of op-amp 127 drops back down to 0V, or the voltage at node $V_{IN}$, because the current through resistor 132 is cut off. Also, capacitor 150 begins to recharge.

The same logical high signal with respect to node $V_{IN}$ (which is available from op-amp 127) becomes an indication output. This indication output indicates an overcurrent fault shut down.

Figure 4:
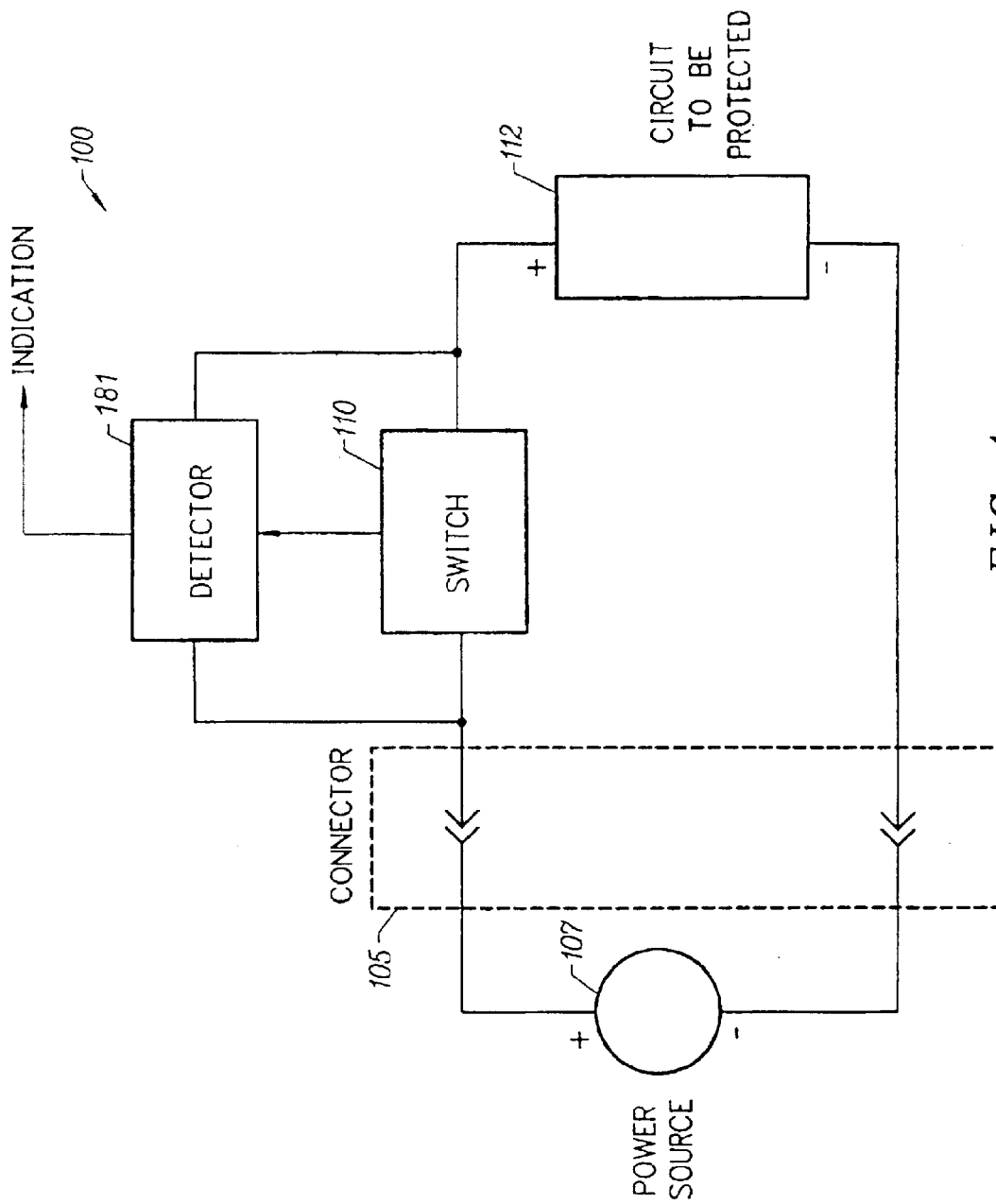
FIG. 4 is a simplified high-level block diagram of an electronic hot-swap protection circuit, according to another embodiment of the present invention.

FIG. 4 is a simplified high-level block diagram of an electronic hot-swap protection circuit 100, according to another embodiment of the present invention. Hot-swap protection circuit 100 FIG. 4 is configured similarly to that of FIG. 1 except that circuit 100 of FIG. 4 includes a detector 181 that detects whether load 112 is hot-swapped out, i.e., disconnected from power source 107. In this specific embodiment, detector 181 couples in parallel to a switch 110. Switch 110 couples in series to a terminal of power source 107 via connector 105 and to load 112.

When detector 181 detects a disconnect event, it outputs a hot-swap occurrence indication, or "indication," or "control signal." More specifically, detector 181 sends a hot-swap occurrence indication, i.e., a disconnect control signal, to switch 110 causing it to open, i.e., turn off. Switch 110 opens quickly.

Hot-Swap Occurrence Indication

As stated above, the hot-swap occurrence indication can serve other functions which depend on the specific application. For example, the indication can be coupled to drive an LED to notify a user of the hot-swap occurrence. The indication can also send a signal to a controller or microprocessor as an interrupt signal to perform appropriate processing in the occurrence of a disconnect. During a disconnect event in a storage device, for example, certain cleanup operations can be performed before the drive loses all of its power.

Figure 5:
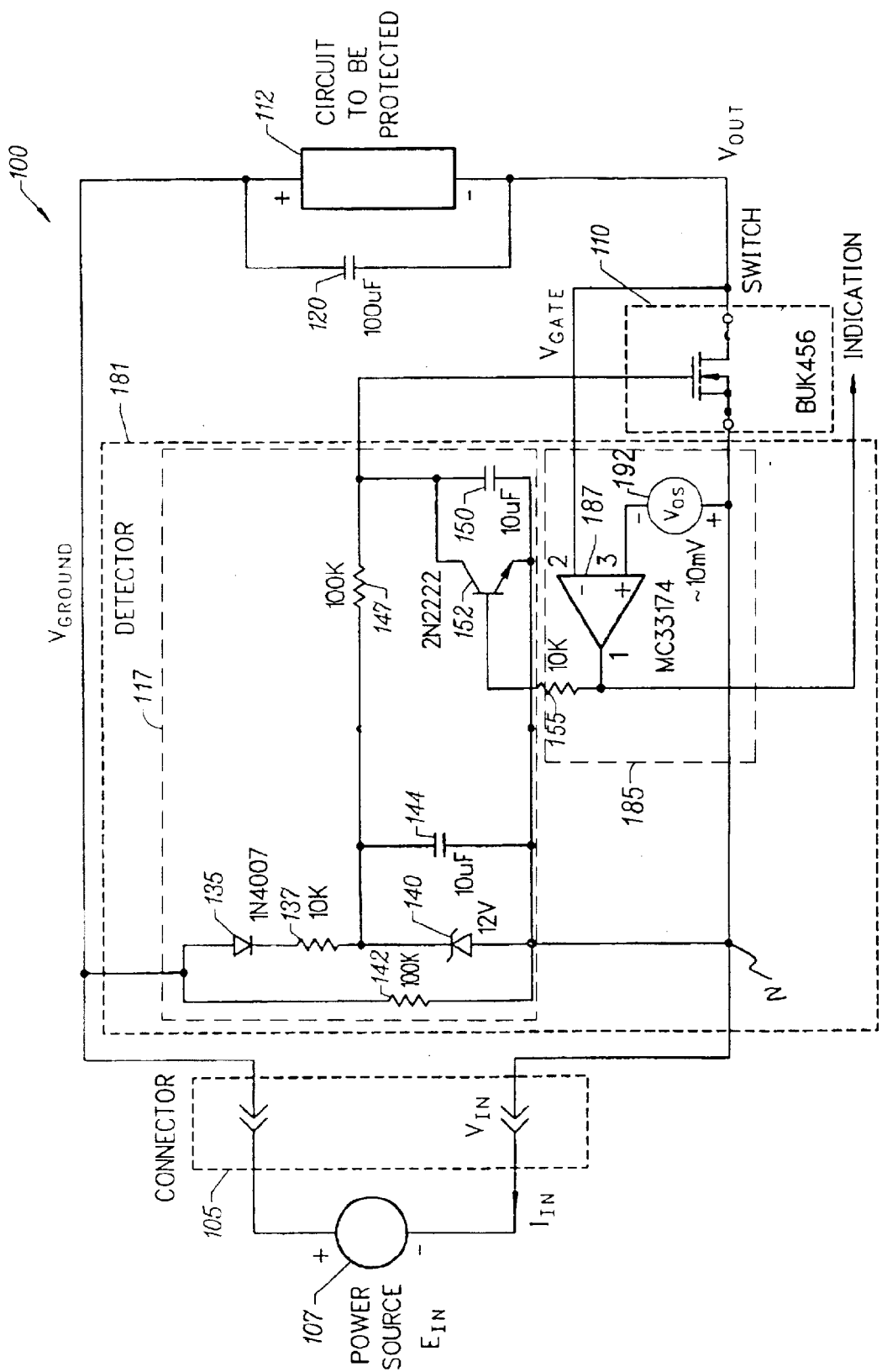
FIG. 5 is a simplified high-level schematic diagram of the hot-swap protection circuit of FIG. 4, according to one embodiment of the present invention.

FIG. 5 is a simplified high-level schematic diagram of a hot-swap protection circuit 100, which in some embodiments of the present invention, can be used to implement the hot-swap protection circuit of FIG. 4. Like hot-swap protection circuit 100 of FIG. 4, that of FIG. 5 is implemented with commonly available integrated circuits including discrete-active and-passive components.

Hot-swap protection circuit 100 of FIG. 5 includes detector 181 and switch 110, both of which are located on the negative terminal of power source 107. Alternatively, in other embodiments, detector 181 and switch 110 can be located on the positive polarity conductor of the power source 107 (as in FIG. 4), with appropriate modifications to the circuitry.

In this specific embodiment, detector 181 of FIG. 5 includes the same elements and configuration as that of FIG. 2 with a few exceptions. Detector 181 of FIG. 5 includes a ground-fault protection circuit 185 in place of overcurrent protection circuit 115 of FIG. 2.

Upon detection of a disconnect event, detector module 185 sends an output indication, or "signal," to control circuit 117. Accordingly, if the signal is triggered by a disconnect event, control circuit 117 sends a disconnect control signal to switch 110 instructing it to open.

Switch 110 couples between the non-inverting input and the inverting input of an op-amp 187 via a voltage source 192.

Operation of Detector 181 upon Disconnection

In operation, hot-swap protection circuit 100 of FIG. 5, functions as a load-disconnect protection circuit. Prior to disconnection, assuming that load 112 is powered normally and operational. The voltage at node $V_{OUT}$ is approximately equal to that at node $V_{IN}$, less the voltage drop across switch 110. The voltage drop across switch 110 is such that the voltage at node $V_{OUT}$ is more positive than that at node $V_{IN}$, because current is being supplied to load 112 through switch 110 from node $V_{IN}$. Op-amp 187 of detector 181 connects across switch 110. The non-inverting input of op-amp 187 couples to a voltage source Vos 192. The value of voltage source 192 is approximately −10 mV and can vary depending on the specific application. The −10 mV ensures that the output of op-amp 187 is low relative to the voltage at node $V_{IN}$, regardless of the current flow of load 112, or regardless of any finite built-in offset voltages of op-amp 187 (assuming that the input offset voltage of op-amp 187<10 mV). This keeps transistor 152 off so that node $V_{GATE}$ is charged to 12V, keeping switch 112 on.

Operation of Ground-Fault Protection Circuit 185 (Load Gets Disconnected)

The following description assumes that at some time T1 connector 105 disconnects due to a ground fault-condition. Because there are no capacitors connected between nodes $V_{GROUND}$ and $V_{IN}$, the voltage at node $V_{IN}$ has the tendency to move towards the voltage at node $V_{GROUND}$. However, this does not happen because the charge on capacitor 120, which was initially charged to the voltage at node $V_{OUT}$. Capacitor 120 sustains a current flow from node $V_{OUT}$ to node $V_{IN}$. As long as there is available charge in capacitor 120 to sustain the current needed by detector 181, it will function properly.

In operation, detector 181 recognizes immediately that the voltage across switch 110 is now reversed, i.e., the voltage at node $V_{OUT}$ is more positive than that at node $V_{IN}$. The output of op-amp 187 goes high to turn on transistor 152, which in turn discharges capacitor 150. This causes switch 110 in switch 110 to turn off which results the disconnection of load 112. This also stops the discharge of capacitor 120 by the detector 181.

In some embodiments of the invention, because the logical high signal that op-amp 187 outputs also functions as a hot-swap occurrence indication, the indication can be sent to other circuits, e.g., LED, controller, microprocessor, etc., for other purposes.

This circuit technique detects the presence (indication low) or absence (indication high) from detector 181, and represents an automatic ground fault detection without the need for separate ground sense pins as needed in the prior art.

It is to be understood that this specific implementation as depicted and described herein is for illustrative purposes only and should not limit the scope of the claims herein, and that alternative circuit implementations exist for the same functionality. For example, any IC chip, proprietary or otherwise, can be used to implements the circuits described herein.

The foregoing circuits can be readily implemented using any of a number of commercially available integrated circuit devices. For example, FIG. 6 illustrates how the hot-swap protection circuit according to the present invention as shown in FIG. 5 can be provided using conventional hot-swap IC devices. Attached as Appendix A is a data sheet for the IC device. Following is a description of the pin outs of the chip:

Pin 1 (INV) provides an invert input function. The invert input controls GSNSin's polarity. When invert input is high compared to AGND, then GSNSin low indicates an insertion/removal event. When invert input is low, then GSNSin high indicates an insertion/removal event.

Pin 15 (GSNSin) provides a ground sense input. The INV pin controls the polarity sense of this input. A 3uA internal pull-up current source causes logic high when there is no connection at this pin. With INV low or connected to AGND, a GSNSin low (or connected to AGND) will keep RSTout and GATE low, and the external power switch, Q1, off. A disconnected GSNSin pin or when Vcc is applied to it will allow normal operation.

Pin 2 (VCCin) is the supply voltage positive power-supply voltage input.

Pin 3 (SHNToff) is the shunt off pin. This pin serves to control the enabling of the shunt circuit. When the pin is high compared to AGND, then the shunt regulator is in off position. A low level at this pin activates the shunt regulator.

Pin 4 (CAPin) is an active lowpass filter capacitor input. The output of the power active filter tracks this pin. Adding an external RC network matching the input noise with respect to the 3db point of the filter could reduce the noise to a minimum.

Pin 5 (VDROP) is an active filter offset voltage pin. This pin sets the drop out MOSFET voltage across the active filter.

Pin 6 (SLOPE) is a slope input pin. This input controls the current slope during power up and controls inrush currents. Adding external capacitors to this pin allow regulation and adjustment of the rate of the current slope.

Pin 7 (OFFTM) is the off-time pin. The OFFTM pin sets the delay time between powerdown and restart of IXHQ100. Delay time can be increased by adding external capacitors to this pin.

Pin 8 (AGND) is the ground pin. This pin provides a system zero reference pin.

Pin 9 (VDDout) is the regulator output voltage pin. The regulator output voltage provides current to drive the external circuits with respect to AGND.

Pin 10 (VCL) is the vercurrent threshold bias voltage pin. This pin sets the overcurrent threshold bias voltage.

Pin 11 (SOURCE) is the current input sensor pin. This serves as the input pin for sensing current through the power device with respect to AGND.

Pin 12 (GATE) in the output pin. This is control voltage pin for driving an external MOSFET.

Pin 13 (OUTsns) is the out sensor signal pin. This signal pin senses the output voltage of the circuit.

Pin 14 (RSTout) is the output reset pin. A low at this pin indicates detection of an insert/removal event or overcurrent detection.

Pin 16 (NC) N/A Not Connected

Figure 7:
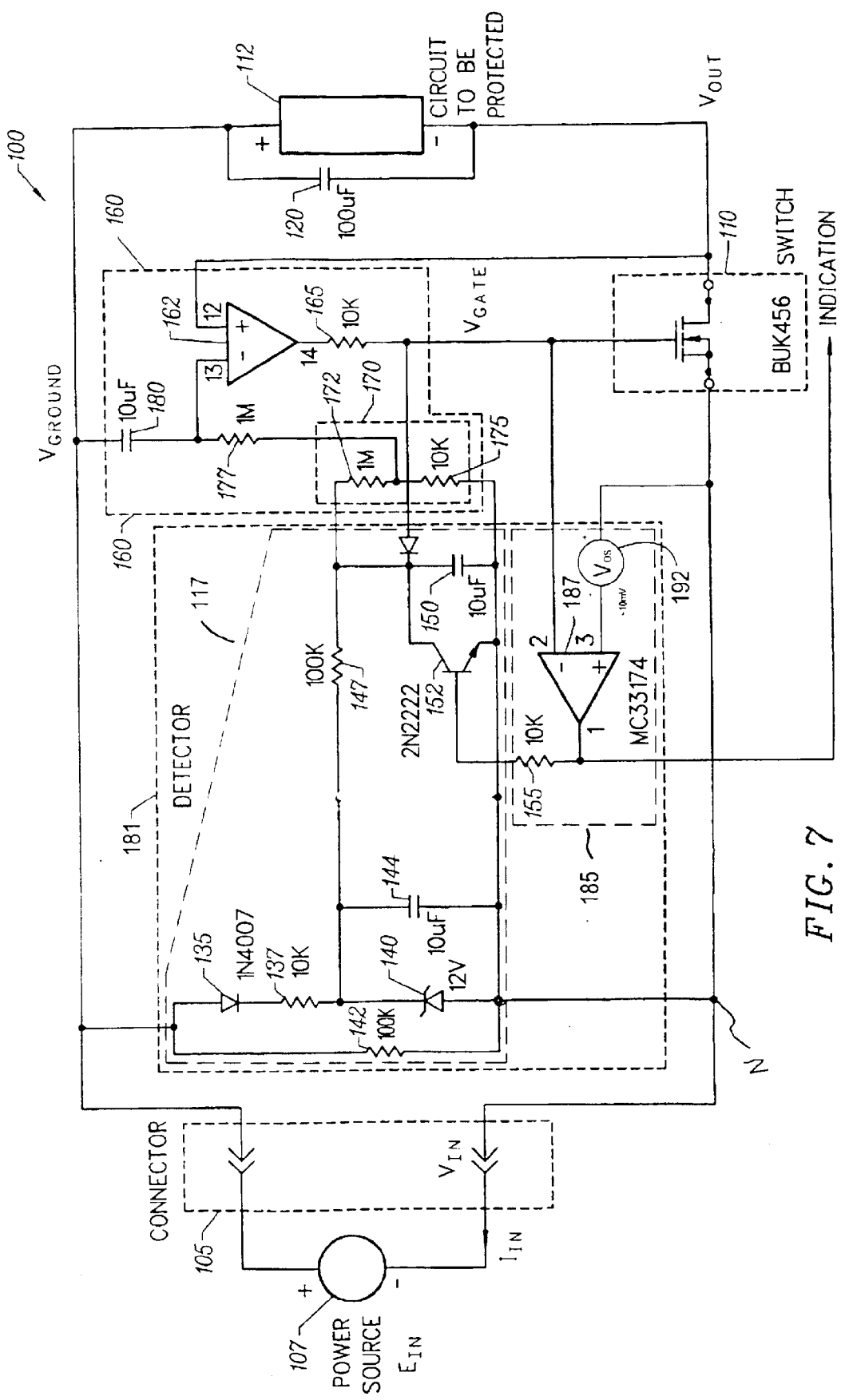
FIG. 7 is a simplified high-level schematic diagram of the hot-swap protection circuit of FIG. 4, according to another embodiment of the present invention.

FIG. 7 is a simplified high-level schematic diagram of a hot-swap protection circuit 100, which in some embodiments of the present invention, can be used to implement the hot-swap protection circuit of FIG. 4. Hot-swap protection circuit 100 of FIG. 7 is similar to that of FIG. 5 except that it includes a filter 160. In this particular embodiment, filter 160 is an active filter. Also, filter 160 of this specific embodiment is implemented with commonly available integrated circuits and discrete active and passive components.

Filter 160 of FIG. 7 includes the same elements and is configured similarly to that of FIG. 3 except that the non-inverting input of op-amp 162 couples to the drain of switch 110 as well as to the inverting input of op-amp 187.

Figure 8:
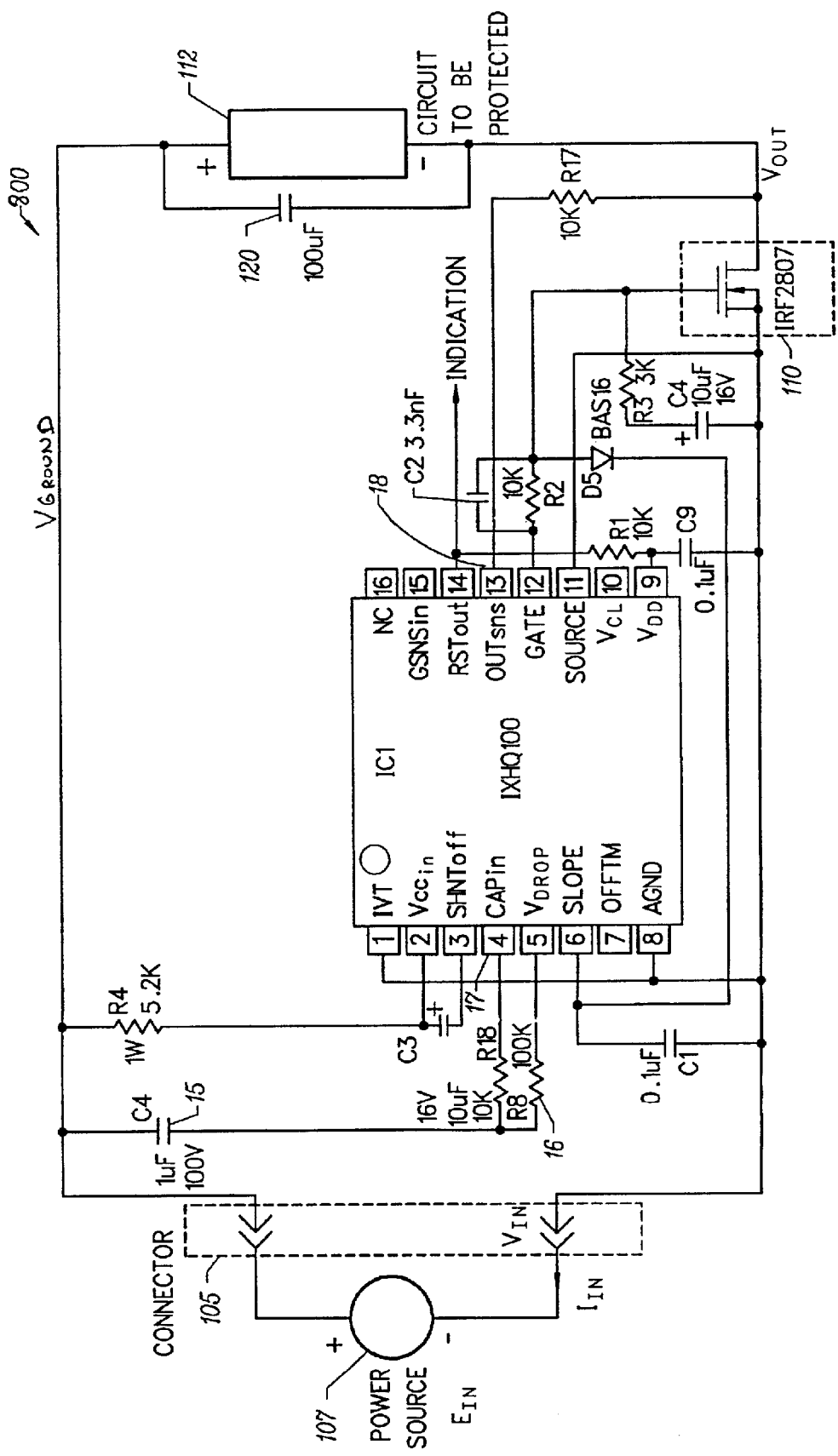
FIG. 8 is a simplified high-level schematic diagram of the hot-swap protection circuit of FIG. 7, according to one embodiment of the present invention.

FIG. 8 further illustrates how the hot-swap protection circuit according to the present invention as shown in FIG. 5 can be provided using conventional hot-swap IC devices. The circuit shown in FIG. 8 uses the IC device described in the data sheet of Appendix A that can be used to implement the hot-swap protection circuit of FIG. 7. In addition, FIG.

1 in the data sheet of Appendix A shows a configuration which implements a hot swap protection circuit according to the present invention as shown in FIG. 3.

Other similar commercially available IC devices can be used to implement the hot swap protection circuits disclosed herein. For example, Linear Technology sells a line of hot swap controllers such as part nos. LT1640AH and LT1640AL. Texas Instruments Incorporated sells a line of hot swap IC devices such as TPS2320 and TPS2321. Maxim Integrated Products sells IC devices such as the MAX5904 which can be used. The disclosed hot swap protection circuitry according to the present invention can be made using such IC devices in conjunction with appropriate external components.

Specific embodiments of the present invention are presented above for purposes of illustration and description. The full description will enable others skilled in the art to best utilize and practice the invention in various embodiments and with various modifications suited to particular uses. After reading and understanding the present disclosure, many modifications, variations, alternatives, and equivalents will be apparent to a person skilled in the art. The foregoing, therefore, is not intended to be exhaustive or to limit the invention to the specific embodiments described. The claimed invention is intended to be accorded the widest scope consistent with the principles and novel features disclosed herein, and as recited in the following claims.

What is claimed is:

1. A circuit comprising:
   a positive terminal and a negative terminal:
   a switch configured to couple a target circuit with a source of power;
   a first detector configured to be selectively coupled to and decoupled from the source of power, the first detector operatively coupled with the switch, wherein the switch closes responsive to the first detector; and
   a second detector configured to detect noise in the power, the second detector operatively coupled to the switch, wherein a conductivity of the switch varies responsive to the second detector,
   wherein the first detector comprises a resistor and a capacitor configured as an RC circuit that is in electrical communication with the source of power,
   wherein the switch is a transistor device having a gate terminal coupled to the RC circuit, so that the switch gradually closes as the RC circuit is charged by the source of power,
   wherein the second detector comprises:
      a bias voltage source; and
      an operational amplifier having:
         an inverting input coupled with the positive terminal and coupled with the bias voltage source;
         a non-inverting input coupled with a negative terminal; and
         an output coupled to the gate of the switch.

2. The circuit of claim 1 wherein the second detector couples between the source of power source and the gate of the switch.

3. The circuit of claim 1 wherein the output of the operational amplifier couples with the first detector.

4. The circuit of claim 1 wherein the bias voltage source coupled with the first detector.

5. The circuit of claim 4 wherein the bias voltage source is a voltage divider.

6. A circuit comprising:
   a switch configured to couple a target circuit with a source of power;
   a filter;
   a first detector configured to be selectively coupled to and decoupled from the source of power, the first detector operatively coupled with the switch, wherein the switch gradually closes responsive to the first detector being coupled to the source of power; and
   a second detector configured to sense current being supplied to the target circuit and to detect when the current exceeds a threshold, wherein the switch opens responsive to the second detector,
   wherein the first detector comprises a resistor and a capacitor configured as an RC circuit,
   wherein the switch is a first transistor having a gate terminal coupled to the RC circuit via the filter,
   wherein the RC circuit is in electrical communication with the source of power so that the switch gradually closes as a result of charging of the RC circuit by the source of power.

7. The circuit of claim 6 wherein the switch closes at a slower rate than it opens.

8. The circuit of claim 6 wherein the switch is characterized by having a variable conductance, wherein the switch closes at a slow rate such that its conductance is gradually increased.

9. The circuit of claim 6 wherein the first detector and the switch are coupled to the positive terminal of the source of power.

10. The circuit of claim 6 wherein the first detector and the switch are coupled to the negative terminal of the source of power.

11. The circuit of claim 6 wherein the first transistor is a FET transistor.

12. The circuit of claim 6 wherein the second detector comprises a first op-amp operatively coupled between the first detector and the switch.

13. The circuit of claim 12 wherein the second detector further comprises a resistor coupled between the first op-amps inputs.

14. The circuit of claim 12 wherein the second detector further comprises a second power source coupled between one of the first op-amp inputs and the source of power.

15. A circuit comprising:
   a switch configured to couple a target circuit with a source of power;
   a filter;
   a first detector configured to be selectively coupled to and decoupled from the source of power, the first detector operatively coupled with the switch, wherein the switch closes responsive to the first detector; and
   a second detector configured to detect when the source of power is decoupled from the target circuit, wherein the switch opens responsive to the second detector,
   wherein the first detector comprises a resistor and a capacitor configured as an RC circuit in electrical communication with the source of power,
   wherein the switch is a transistor device having a gate terminal coupled to the RC circuit via the filter, so that the switch gradually closes as a result of charging of the RC circuit by the source of power.

16. The circuit of claim 15 wherein the second detector comprises a first op-amp operatively coupled between the first detector and the switch.

17. A circuit comprising:
   a switch configured to couple a target circuit with a source of power;
   a filter;
   a first detector configured to be selectively coupled to and decoupled from the source of power, the first detector operatively coupled with the switch, wherein the switch closes responsive to the first detector; and a second detector configured to detect a voltage change from a non-zero voltage towards a zero voltage, wherein the switch opens responsive to the second detector, wherein the first detector comprises a resistor and a capacitor configured as an RC circuit in electrical communication with the source of power, wherein the switch is a transistor device having a gate terminal coupled to the RC circuit via the filter, so that the switch gradually closes as a result of charging of the RC circuit by the source of power.

18. The circuit of claim 17 wherein the second detector comprises a first op-amp operatively coupled between the first detector and the switch.

19. A circuit for coupling a power source to a device comprising:

first circuit means for detecting a connection event wherein a connection is made between a device and a power source, the first circuit means configured to be selectively coupled to and decoupled from the power source;

second circuit means, responsive to the first circuit means, for varying the amount of power from the power source that is applied to the device, the second circuit means comprising an RC circuit coupled so as to be charged by the power source, wherein a voltage developed by the RC circuit is provided to the first circuit means, the voltage being less than the voltage of the power source;

third circuit means for filtering electrical noise originating from the power source to produce a filtered signal; and fourth circuit means for producing a control signal responsive to the filtered signal, the second circuit means further being responsive to the control signal so that the amount of power that is applied to the device is protected from the electrical noise.

* * * * *